United States Patent
Ivanov et al.

(10) Patent No.: US 6,359,512 B1
(45) Date of Patent: Mar. 19, 2002

(54) SLEW RATE BOOST CIRCUITRY AND METHOD

(75) Inventors: Vadim V. Ivanov; Shilong Zhang; Gregory H. Johnson, all of Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/765,267

(22) Filed: Jan. 18, 2001

(51) Int. Cl.[7] .............................. H03F 3/45; H03F 3/18; H03F 3/26
(52) U.S. Cl. ..................... 330/255; 330/264; 330/267
(58) Field of Search ................................ 330/253, 255, 330/264, 267

(56) References Cited

U.S. PATENT DOCUMENTS

| | | | |
|---|---|---|---|
| 3,737,800 A | 6/1973 | Russell et al. | 330/207 |
| 4,048,575 A | 9/1977 | Musa | 330/22 |
| 4,628,279 A | 12/1986 | Nelson | 330/257 |
| 4,636,743 A * | 1/1987 | Cotreau | 330/255 |
| 4,783,637 A | 11/1988 | Cotreau | 330/295 |
| 5,045,806 A | 9/1991 | Yan | 330/252 |
| 5,148,118 A | 9/1992 | Dobkin et al. | 330/252 |
| 5,177,450 A * | 1/1993 | Lee et al. | 330/253 |

(List continued on next page.)

OTHER PUBLICATIONS

"A Class–AB High–Speed Low–Power Operational Amplifier in BiCMOS Technology", by Subhajit Sen and Bosco Leung, IEEE Journal of Solid–State Circuits, vol. 31, No. 9, Sep. 1996, pp. 1325–1330.

"A Monolithic Microsystem for Analog Synthesis of Trigonometric Functions and Their Inverses", by Barrie Gilbert, IEEE Journal of Solid–State Circuits, vol. SC–17, No. 6, Dec. 1982, pp. 1179–1191.

Primary Examiner—Robert Pascal
Assistant Examiner—Patricia T. Nguyen
(74) Attorney, Agent, or Firm—W. Daniel Swayze, Jr.; W. James Brady; Frederick J. Telecky, Jr.

(57) ABSTRACT

An operational amplifier includes a differential input stage (30) having first (2) and second (3) input conductors, a class AB output stage (20) coupled to an output of the differential input stage (30) and including a pull-up transistor (M11) having a source coupled to a first supply voltage ($V_{DD}$), a drain coupled to an output conductor (17), and a gate coupled to a first terminal (14) of a class AB control circuit (11), and a pull-down transistor (M12) having a source coupled to a second supply voltage (GND), a drain coupled to the output conductor (17), and a gate coupled to a second terminal (15) of the class AB control circuit (11). A differential input signal is applied between the first (2) and second (3) input conductors, and simultaneously also is applied between first and second inputs of a first unbalanced differential amplifier (31) and between first and second input to the second unbalanced differential amplifier (32). If the differential input signal is of a first polarity and is of a magnitude substantially greater than a threshold voltage of the first unbalanced differential amplifier (31), the magnitude of a turn-on voltage of the pull-down transistor (M12) is decreased and the magnitude of a turn-on voltage of the pull-up transistor (M11) is increased in response to an output voltage produced by the first unbalanced differential amplifier (31). However, if the differential input signal is of a second polarity and is of a magnitude substantially greater than a threshold voltage of the second unbalanced differential amplifier (32), then the magnitude of a turn-on voltage of the pull-up transistor (M11) is increased and the magnitude of a turn-on voltage of the pull-down transistor (M12) is simultaneously decreased, in response to an output voltage produced by the second unbalanced differential amplifier (32).

10 Claims, 6 Drawing Sheets

U.S. PATENT DOCUMENTS

| | | | |
|---|---|---|---|
| 5,216,380 A | 6/1993 | Carbou | 330/253 |
| 5,471,171 A | 11/1995 | Itakura et al. | 330/253 |
| 5,510,754 A | 4/1996 | Moraveji et al. | 330/267 |
| 5,512,859 A | 4/1996 | Moraveji | 330/267 |
| 5,521,552 A | 5/1996 | Butler | 330/257 |
| 5,621,357 A * | 4/1997 | Botti et al. | 330/253 |
| 5,642,078 A | 6/1997 | Navabi et al. | 330/253 |
| 5,854,573 A | 12/1998 | Chan | 330/292 |
| 5,907,262 A | 5/1999 | Graeme et al. | 330/255 |
| 5,917,378 A * | 6/1999 | Juang | 330/255 |
| 6,150,883 A * | 11/2000 | Ivanov | 330/253 |

* cited by examiner

SLEW RATE BOOST CIRCUITRY AND METHOD

BACKGROUND OF THE INVENTION

The invention relates to a circuit and technique for increasing the slew rate of an amplifier.

The term "slew rate" of an amplifier is a measure of how fast the amplifier can charge up a large capacitor that is connected to an output conductor of the amplifier in response to a very rapid increase or decrease (such as a step function increase or decrease) of the input voltage applied to the amplifier. A high slew rate generally is a desirable characteristic of an amplifier, especially an operational amplifier, and especially a high-speed CMOS operational amplifier.

The slew rate of an amplifier generally is equal to the smaller of the tail current sources and floating current sources, divided by the sum of the compensation capacitance required and the parasitic capacitance of the output transistor. One technique for increasing the slew rate of an amplifier is to increase the bias current of the input stage, but that has a tendency to increase the bandwidth of the amplifier. That leads to a requirement to increase the compensation capacitance of the amplifier to improve circuit stability, and that tends to decrease the slew rate.

The article "A Class-AB High-Speed Low-Power Operational Amplifier in BiCMOS Technology", by Subhajit Sen and Bosco Leung, IEEE Journal of Solid-State Circuits, Volume 31, No. 9, September 1986 describes a BiCMOS operational amplifier designed to have very high transconductance, a high slew rate, and a fast small-signal-settling response. The described structure has the disadvantage that it requires use of either bipolar integrated circuit manufacturing technology or BiCMOS manufacturing technology, both of which are substantially more costly than standard CMOS manufacturing technology. The circuit described has the further shortcoming of an undesirably narrow common-mode voltage range.

U.S. Pat. Nos. 4,783,637, 5,512,859 and 5,510,754 disclose amplifiers designed to have high slew rates.

Until now, there have been very few high-speed CMOS operational amplifiers commercially available. This is because until very recently the channel lengths of CMOS transistors that could be readily manufactured using reasonably low-cost CMOS integrated circuit manufacturing processes have not been sufficiently short (i.e., less than about 0.7 microns) to allow CMOS operational amplifiers to compete effectively with high-speed bipolar operational amplifiers manufactured using standard bipolar integrated circuit manufacturing processes.

Thus, there has long been a need for an inexpensive, high-speed, high slew rate integrated circuit operational amplifier which has not been satisfied prior to the previous invention. Especially, there has been need for a low-cost, low voltage CMOS operational amplifier which operates as fast as, and with slew rates as high as, prior bipolar integrated circuit amplifiers.

SUMMARY OF THE INVENTION

Accordingly, it is an object of the invention to provide an inexpensive, high-speed integrated circuit operational amplifier having a high slew rate.

It is another object of the invention to provide an inexpensive, high-speed, high-slew-rate integrated circuit operational amplifier which does not require use of a bipolar integrated circuit manufacturing process or a BiCMOS integrated circuit manufacturing process.

Is another object of the invention to increase the slew rate of a high-speed integrated circuit operational amplifier without increasing the quiescent bias current thereof.

It is another object of the invention to provide an inexpensive, high-speed, high-slew-rate integrated circuit operational amplifier which provides an improvement in the amount of nonlinear distortion of high-speed signals, compared to that of prior bipolar operational amplifiers having high slew rates.

Is another object of the invention to provide a low voltage CMOS amplifier that is as fast as a traditional high-speed, high-voltage, high-slew-rate bipolar integrated circuit amplifier.

It is another object of the invention to prevent instability in a high slew rate CMOS amplifier by accurately controlling the amount of slew boost current therein.

Briefly described, and in accordance with one embodiment thereof, the invention provides an operational amplifier which includes a differential input stage (30) having first (2) and second (3) input conductors, a class AB output stage (20) coupled to an output of the differential input stage (30) and including a pull-up transistor (M11) having a source coupled to a first supply voltage (VDD), a drain coupled to an output conductor (17), and a gate coupled to a first terminal (14) of a class AB control circuit (11), and a pull-down transistor (M12) having a source coupled to a second supply voltage (GND), a drain coupled to the output conductor (17), and a gate coupled to a second terminal (15) of the class AB control-circuit (11). A differential input signal is applied between the first (2) and second (3) input conductors, and simultaneously also is applied between first and second inputs of a first unbalanced differential amplifier (31) and between first and second inputs of a second unbalanced differential amplifier (32). If the the differential input signal is of a first polarity and is of a magnitude substantially greater than a threshold voltage of the first unbalanced differential amplifier (31), the magnitude of a turn-on voltage of the pull-down transistor (M12) is decreased and the magnitude of a turn-on voltage of the pull-up transistor (M11) is increased, both in response to an output voltage produced by the first unbalanced differential amplifier (31). However, if the differential input signal is of a second polarity and is of a magnitude substantially greater than a threshold voltage of the second unbalanced differential amplifier (32), then the magnitude of a turn-on voltage of the pull-up transistor (M11) is increased and the magnitude of a turn-on voltage of the pull-down transistor (M12) is simultaneously decreased, both in response to an output voltage produced by the second unbalanced differential amplifier (32).

In one embodiment of the invention, an operational amplifier (1) includes a differential input stage (30) having first (2) and second (3) input conductors and first (4) and second (5) output conductors and a class AB output stage (20). The class AB output stage includes a pull-up transistor (M11) having a source coupled to a first supply voltage ($V_{DD}$), a drain coupled to an output conductor (17), and a gate coupled to a first terminal (14) of a class AB control circuit (11). The class AB output stage (20) also includes a pull-down transistor (M12) having a source coupled to a second supply voltage (GND), a drain coupled to the output conductor (17), and a gate coupled to a second terminal (15) of the class AB control circuit (11). A gain stage (24) includes an input coupled to at least one of the first (4) and second (5) output conductors of the differential input stage (30). The gain stage (24) has an output coupled to the second terminal (15) of the class AB control circuit (11). In accordance with the present invention, a slew rate boost circuit (10) includes a first unbalanced differential amplifier (31) having a first input coupled to the first input conductor (2) and a second input coupled to the second input conductor (3) and first (6) and second (7) output conductors. The slew rate boost circuit (10) also includes a second unbalanced differential amplifier (32) having a first input coupled to the first input conductor (2) and a second input coupled to the second input conductor (3) and first (8) and second (9) output conductors. A first boost amplifier (22) includes first and second inputs coupled to the first (6) and second (7) outputs, respectively, of the first unbalanced amplifier (31), and a second boost amplifier (21) having first and second inputs coupled to the first (8) and second (9) outputs, respectively, of the second unbalanced amplifier (32). First (M5) and second (M10) transistors each have a gate coupled to an output of the first boost amplifier (22). The first transistor (M5) has a source coupled to the second output (7) of the first unbalanced amplifier (31) and a drain coupled to the first supply voltage ($V_{DD}$). The second transistor (M10) has a source coupled to the second supply voltage (GND) and a drain coupled to the second terminal (15) of the class AB control circuit (11). Third (M6) and fourth (M7) transistors each have a source coupled to the first supply voltage ($V_{DD}$) and a gate coupled to an output of the second boost amplifier (21). The third transistor (M6) has a drain coupled to the first output (8) of the second unbalanced amplifier (32). The fourth transistor (M7) has a drain coupled to the first terminal of the class AB control circuit (11).

DETAILED DESCRIPTION OF THE PREFERRED EMBODIMENTS

Figure 1:
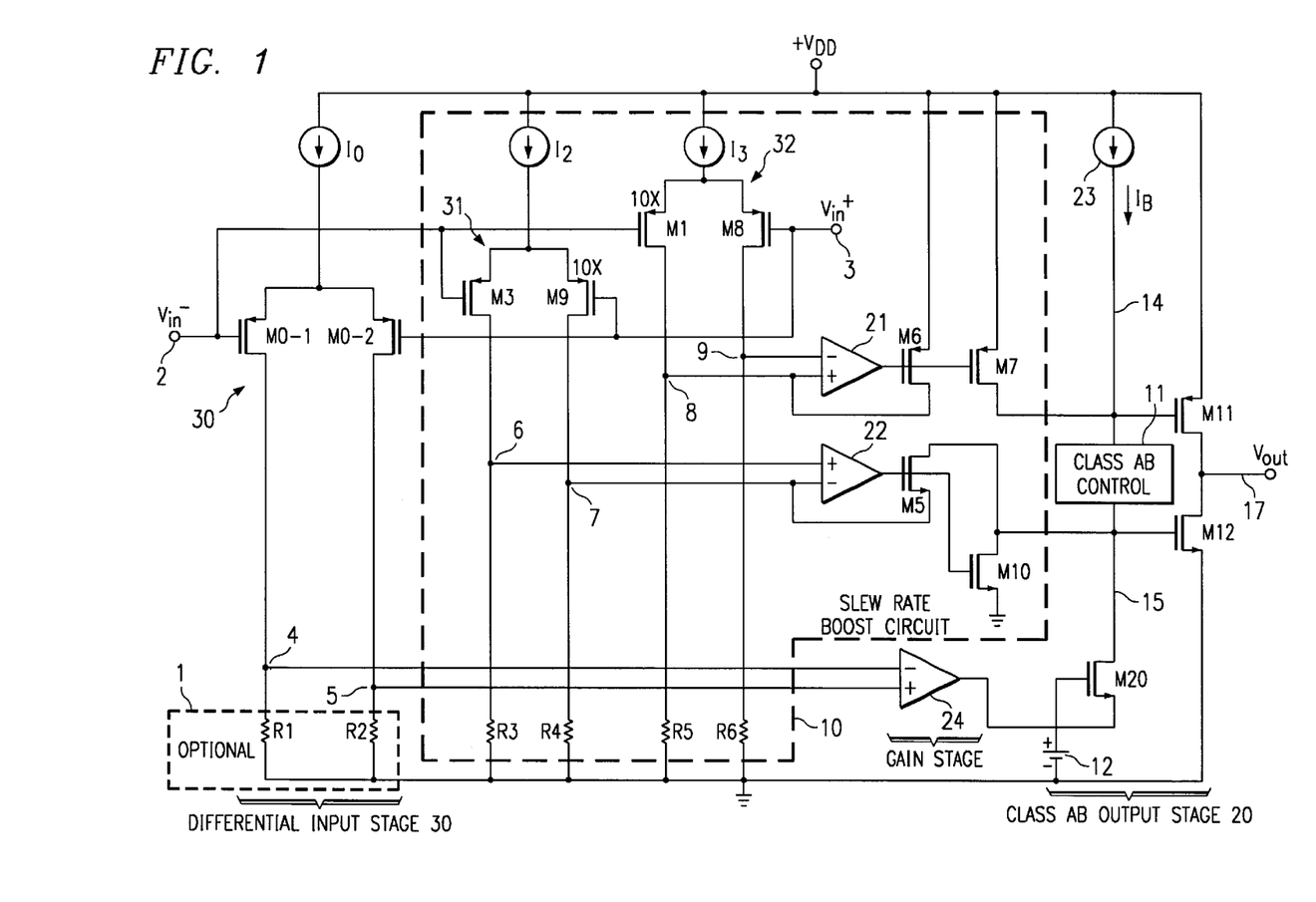
FIG. 1 is a schematic diagram of one embodiment of the present invention.

Enclosed FIG. 1 illustrates an operational amplifier 1 that includes a differential input stage 30, a slew rate boost circuit 10 (shown within the dashed lines) in accordance with the present invention, and a class AB output stage 20. Differential input stage 30 includes first and second P-channel input transistors or MOSFETs M0-1 and M0-2 which have their sources coupled by a constant current source $I_0$ to a positive supply voltage +$V_{DD}$. The gate of MOSFET M0-1 is connected to input conductor 2, to which an input voltage $V_{in}^-$ is applied. The gate of MOSFET M0-2 is connected to input conductor 3, to which an input voltage $V_{in}^+$ is applied. Thus, a differential input voltage $V_{in}$ equal to $V_{in}^+$ minus $V_{in}^-$ is applied between input terminals 2 and 3.

The drain of MOSFET M0-1 is connected by conductor 4 to the (−) input of an amplifier 24 and also is coupled to ground by a resister R1. The drain of MOSFET M0-2 is connected by conductor 5 to the (+) input of a gain stage amplifier 24 and also is coupled to ground by a resister R2.

Class AB output stage 20 includes a P-channel pull up MOSFET M11 having its source connected to +$V_{DD}$, its drain connected to output conductor 17 on which an output voltage $V_{OUT}$ is produced, and its gate connected by conductor 14 to one terminal of a constant current source 23 and to the upper terminal of a class AB control circuit 11. Constant current source 23 provides a suitable quiescent bias current $I_B$ to class AB control circuit 11. Class AB output stage 20 also includes an N-channel pull-down MOSFET M12 having its source connected to ground, its drain connected to $V_{OUT}$, and its gate connected by conductor 15 to a lower terminal of class AB control circuit 11 and to the drains of an N-channel MOSFET M20 and an N-channel MOSFET M10, respectively. The gate of MOSFET M20 is connected to the (+) terminal of a reference voltage source circuit 12. The source of MOSFET M20 is connected to the output of gain stage amplifier 24. (It would be possible to eliminate amplifier 24 and provide another means of coupling conductors 4 and 5 to the source of MOSFET M20.

Differential input stage 30, amplifier 24, MOSFET M20, pull-up MOSFET M11, pull-down MOSFET M12, and class AB control circuit 11, and current source circuitry 23 all are conventional, for example as shown in U.S. Pat. No. 5,311,145, issued May 10, 1984 entitled "Cmbination Driver-Summing Circuit for Rail-to-Rail Differential Amplifier" by Huijsing et al., incorporated herein by reference.

The slew rate boost circuit 10 of the present invention includes a first "unbalanced" differential stage 31 and a second "unbalanced" differential stage 32. Unbalanced differential stage 31 includes a constant tail current source $I_2$, a P-channel input MOSFET M3 having its source electrode connected to tail current source 12 and to the source of a much larger P-channel input MOSFET M9. The drains of MOSFETs M3 and M9 are connected by conductors 6 and 7 to load resisters R3 and R4, respectively. The drains of MOSFETs M3 and M9 also are connected by conductors 6 and 7 to the (+) and (−) inputs of a differential boost amplifier 22. The channel-width-to-channel-length ratio of MOSFET M9 is approximately 10 times greater than that of MOSFET M3 (hence the term "unbalanced"), as indicated by "10X" adjacent thereto. Similarly, unbalanced differential gain boost stage 32 includes a constant tail current source $I_3$ connected to the sources of P-channel MOSFETs M1 and M8. The channel-width-to-channel-length ratio of MOSFET M1 is approximately 10 times that of MOSFET M8, as indicated by "10X" adjacent thereto. The drain of MOSFET M1 is connected by conductor 8 to one terminal of resister R5 and to the (+) input of a differential boost amplifier 21. The drain of MOSFET M8 is connected by conductor 9 to one terminal of resister R6 and to the (−) input of amplifier 21. The other terminals of resisters R5 and R6 are connected to ground.

The above mentioned differential input voltage $V_{in}$ equal to $V_{in}^+$ minus $V_{in}^-$ applied between input terminals 2 and 3 of operational amplifier 1 also is applied between the inputs of differential stages 31 and 32. Input terminal 2 is connected to the gate of P-channel input MOSFET M0-1 of differential input stage 30 and also to the gates of P-channel MOSFETs M3 and M1 of unbalanced stages 31 and 32, respectively. Input terminal 3 of operational amplifier 1 is connected to P-channel MOSFET M0-2 and also to the gates of P-channel MOSFETs M8 and M9 of unbalanced stages 32 and 31, respectively. (Note that resisters R1 and R2 are provided if gain stage amplifier 24 is designed to respond to a differential voltage signal, but are omitted if gain stage amplifier 24 is designed to operate in response to a differential output current flowing through conductors 4 and 5.)

The output of boost amplifier 22 is connected to the gate electrodes of N-channel MOSFETs M5 and M10. The source of MOSFET M5 is connected to conductor 7. The drain of MOSFET M5 is connected by conductor 15 to the drains of MOSFET M10 and MOSFET M20, the gate of pull-down MOSFET M12, and to the lower terminal of class AB control circuit 11. The source of MOSFET M10 is connected to ground.

Similarly, the output of boost amplifier 21 is connected to the gate electrodes of P-channel MOSFETs M6 and M7, the sources of which are connected to $V_{DD}$. The drain of MOSFET M6 is connected to conductor 8. The drain of MOSFET M7 is connected by above mentioned conductor 14 to the gate of pull-up MOSFET M-11 and also to the upper terminal of class AB control circuit 11, and to constant current source 23.

The connections of boost amplifier 22, MOSFETs M5 and M10, and resister R4 as shown results in a well-controlled amount of slew-down boost current when a large differential input voltage is applied to amplifier 1. For example, if Vin+ is much larger than Vin−, then essentially all of the current I2 flows through MOSFET M3 and resister R3. The connections of boost amplifier 22, MOSFETs M5 and M10, and class AB control circuit 11 as shown causes boost amplifier 22 to operate so as to equalize its input voltages, i.e. equalize the voltages on conductors 6 and 7. That causes a current equal to I2 to flow through resister R4 if resisters R4 and R3 are equal. That amount of current through resister R4 also flows through MOSFET M5,, and hence through MOSFET M10, assuming suitable matching of the transistors, and therefore precisely determines the amount of slew-down boost current drawn out of conductor 15 from the large compensation capacitance between the gate and drain of pull-down MOSFET M12 and from the lower terminal of class AB control circuit 11. Similarly, the boost amplifier 21 causes an amount of current equal to the tail current I3 to flow through MOSFET M6, and hence through transistor M7, assuming suitable matching of the transistors, and therefore precisely determines the amount of slew-up current into conductor 14.

Thus, the slew boost circuit of the present invention does not cause an uncontrolled, unlimited amount of current to operate the operational amplifier 1 as fast as possible with a high slew rate. Instead, the above described circuitry including MOSFETs M5 and M10, resister R4, boost amplifier 22, and the tail current I2 operate to determine and control the amount of slew down boost current. Similarly, MOSFETs M6 and M7, resister R5, boost amplifier 21, and tail current I3 operate to determine and control the amount of slew up boost current. This has the advantage of preventing the circuitry from becoming unstable.

The fact that MOSFET M9 of unbalanced differential amplifier 31 is 10 times larger than MOSFET M3 creates therein a "built-in threshold voltage" which "unbalances" amplifier 31. A result of this built-in threshold voltage is that a much smaller decrease of the voltage on input conductor 3 is needed to steer most of the tail current 12 into MOSFET M9 than is required on input terminal 2 to steer most of I2 into MOSFET M3. Similarly, amplifier 32 is "unbalanced" due to a built-in threshold voltage caused because MOSFET M1 is 10 times larger than MOSFET M8.

Figure 2:
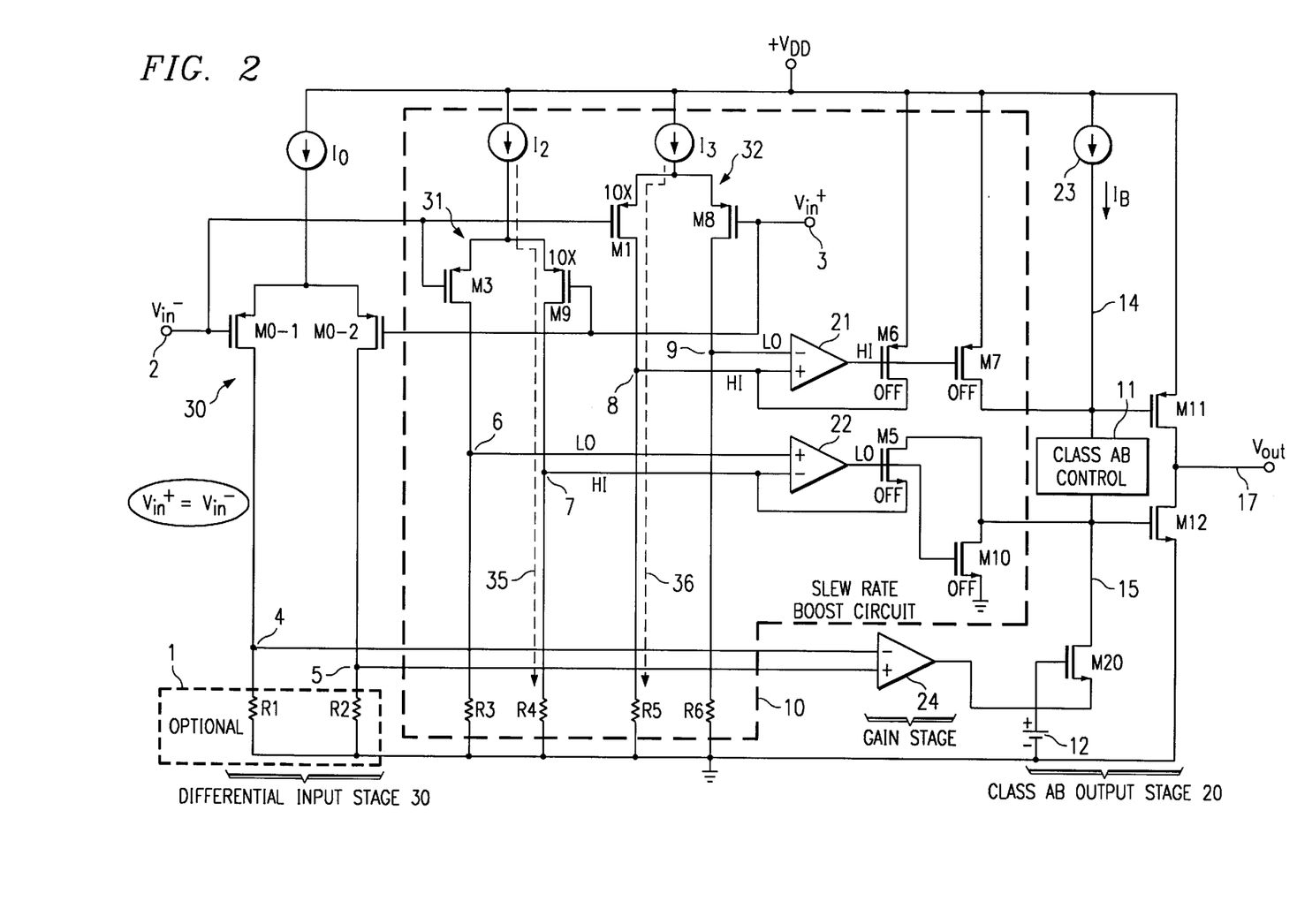
FIGS. 2, 3, and 4 are schematic diagrams as shown in FIG. 1, slightly modified to illustrate three different modes of operation of the operational amplifier of FIG. 1.

FIG. 2 illustrates the operation of slew rate boost circuit 10 when $V_{in}^+$ and $V_{in}^-$ are at the same voltage. In this case, essentially all of $I_2$ flows through MOSFET M9, as indicated by arrows 35. This causes the voltage on conductor 7 to be "high", i.e., substantially larger than the "low" voltage on conductor 6. This causes the output of boost amplifier 22 to be at a low voltage, which turns MOSFETs M5 and M10 off, as indicated. At the same time, essentially all of tail current $I_3$ is steered through MOSFET M1, as indicated by arrows 36. Consequently, the voltage on conductor 8 is high and the voltage on conductor 9 is low, as indicated. This causes the output of boost amplifier 22 to be high, which turns MOSFETs M6 and M7 off, as indicated. To summarize, when $V_{in}^+$ and $V_{in}^-$ are at the same or nearly the same voltage, MOSFETs M7 and M10 are off, and therefore do not affect the voltages on conductors 14 and 15, and hence have no effect on the slew rate of operational amplifier 1.

Therefore, the degree to which pull-up MOSFET 11 and pull-down MOSFET 12 are turned on or off is determined by small differences between $V_{in}^+$ and $V_{in}^-$, the gain of differential input stage 30, the gain of amplifier 24, the size of MOSFET M20 and the characteristics of class AB control circuit 11.

Figure 3:
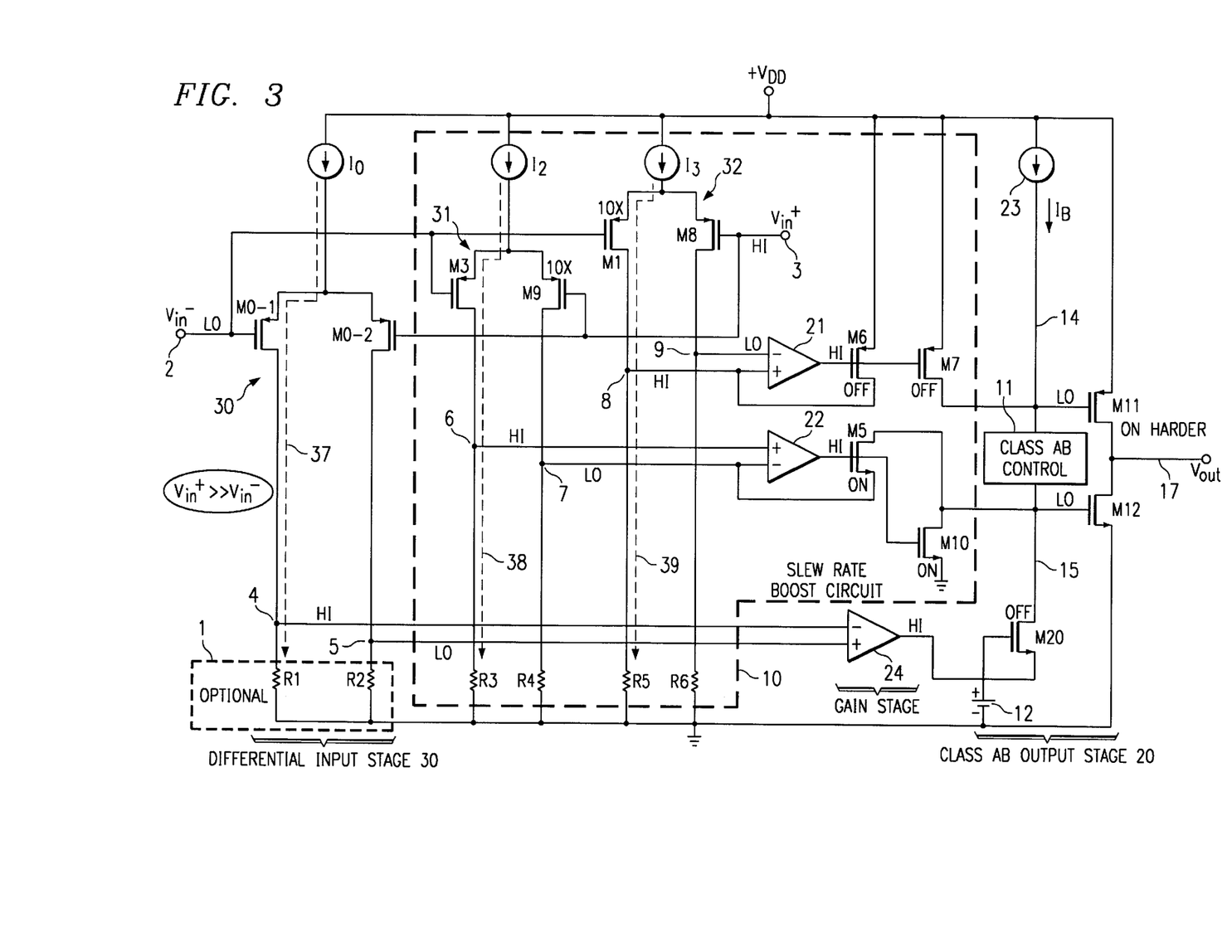

FIG. 3 illustrates the operation of slew rate boost circuit 10 if $V_{in}^+$ is substantially greater than $V_{in}^-$. If $V_{in}^+$ is enough greater than $V_{in}^-$ to exceed the above mentioned built-in threshold voltage, then substantially all of tail current 12 is steered from MOSFET M9 into MOSFET M3, as indicated by arrows 38. This causes the voltage on conductor 6 to be high and the voltage on conductor 7 to be low, as indicated. That causes the output of boost amplifier 22 to be high, which turns MOSFETs M5 and M10 on, as indicated. That tends to pull the voltage on conductor 15 low. The low voltage on conductor 15 has two effects, the first effect being to tend to turn pull-down MOSFET M12 off. The second effect is to cause class AB control circuit 11 to pull the voltage on conductor 14 to a relatively low value. That tends to turn pull-up MOSFET M11 on harder, thereby boosting the slew rate at which pull-up MOSFET M11 supplies output current to rapidly charge up or slew up the voltage $V_{out}$ on a large output capacitance (not shown) that typically is connected to output conductor 17. At the same time, most of tail current $I_3$ is steered through MOSFET M1 as indicated by arrows 39, causing the voltage on conductor 8 to be high and the voltage on conductor 9 to be low. This causes the output of boost amplifier 21 to be high, which turns MOSFETs M6 and M7 off as indicated, so they have no effect on the voltage of conductor 14.

Figure 4:
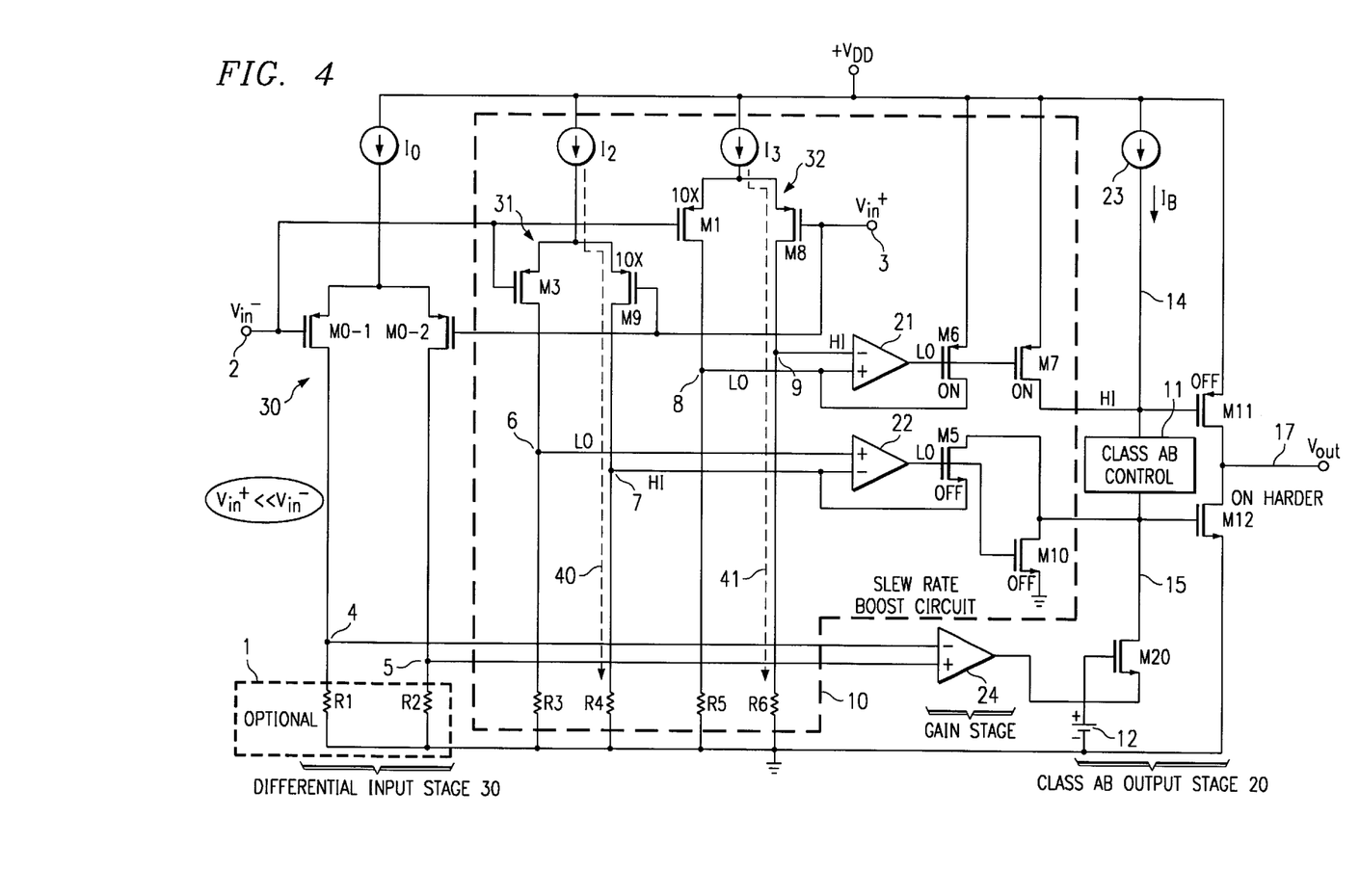

FIG. 4 illustrates the operation of the slew rate boost circuit 10 if $V_{in}^+$ is substantially less than $V_{in}^-$. If $V_{in}^-$ is enough greater than $V_{in}^+$ to exceed the above mentioned built-in threshold voltage and steer the tail current $I_2$ through MOSFET M9 as indicated by arrows 40 and to steer tail current $I_3$ through MOSFET M8 as indicated by arrows 41, then the voltage on conductor 6 is low, the voltage on conductor 7 is high, the voltage on conductor 8 is low, and the voltage on conductor 9 is high, as indicated. This causes the output of boost amplifier 22 to be low, which turns MOSFETs M5 and M10 off so they do not affect the voltage on conductor 15. The output of boost amplifier 21 is low, which turns MOSFETs M6 and M7 on as indicated, so they tend to increase the voltage on conductor 14 toward $V_{DD}$. This has two effects. The first effect is to turn pull-up MOSFET M11 off. The other effect is to cause class AB control circuit 11 to increase the voltage on conductor 15, which tends to turn pull-down MOSFET M12 on harder, thereby boosting the slew rate at which pull-down MOSFET M12 sinks output current from the above mentioned large output capacitance, thereby tending to boost the rate at which operational amplifier 1 discharges or slews down the voltage $V_{out}$.

The above described slew rate boost circuit increases the slew rate of a high-speed CMOS operational amplifier capable of rail-to-rail operation and having a gain of approximately 100 dB and bandwidth of 200 MHz while keeping the overall quiescent bias current $I_B$ at a very low value, for example 1 mA. The above described slew rate boost circuit also provides a low cost CMOS operational amplifier having high frequency performance comparable to that of prior bipolar integrated circuit operational amplifiers, and yet also provides good low noise performance, and accomplishes operation at low rail-to-rail power supply voltages. This satisfies a need for high-speed, high-slew-rate CMOS operational amplifiers which previously has been satisfied only by much more expensive, high power bipolar integrated circuit operational amplifiers.

Figure 5:
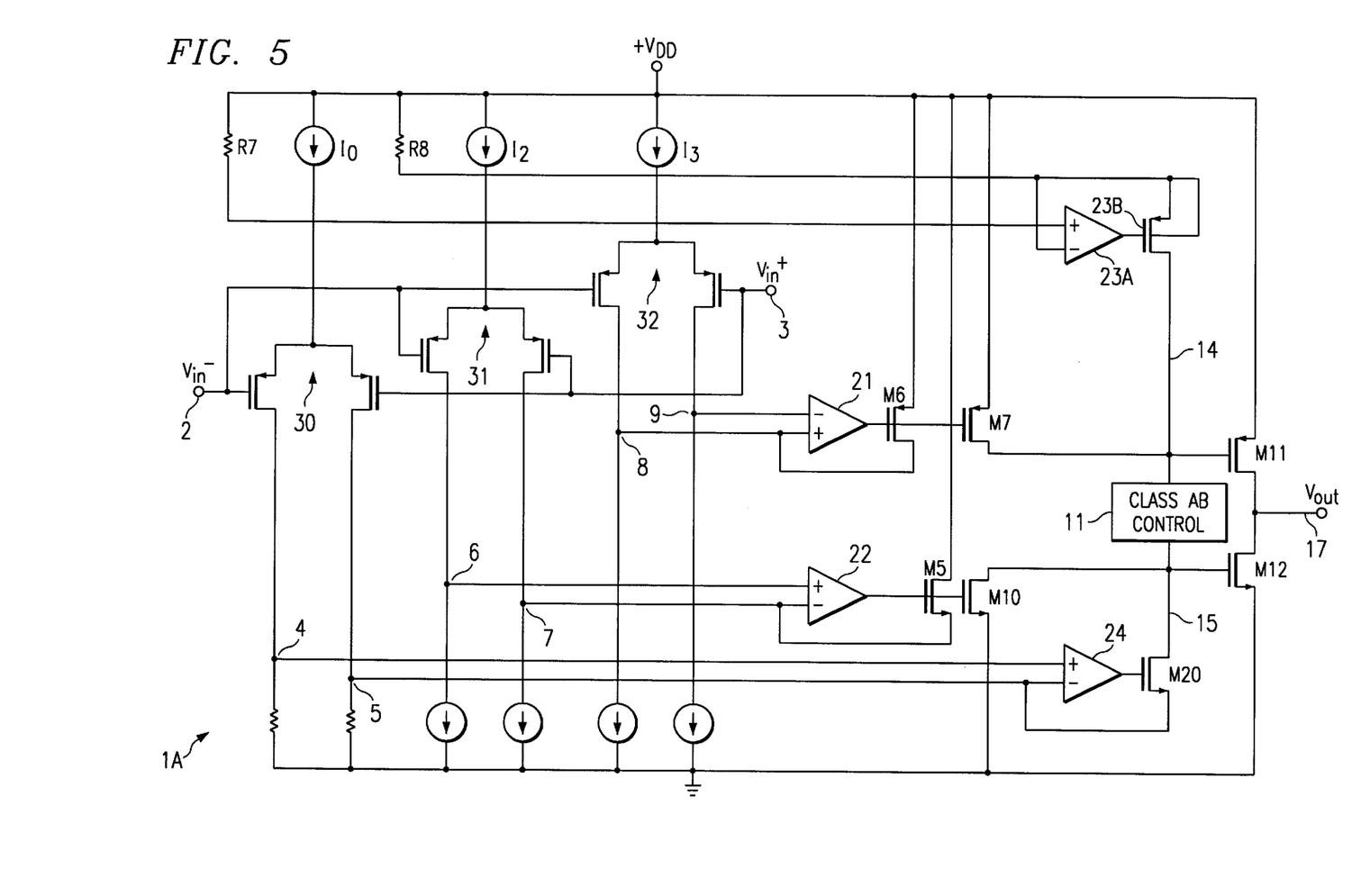
FIG. 5 is a schematic diagram of another embodiment of the invention.
Figure 6:
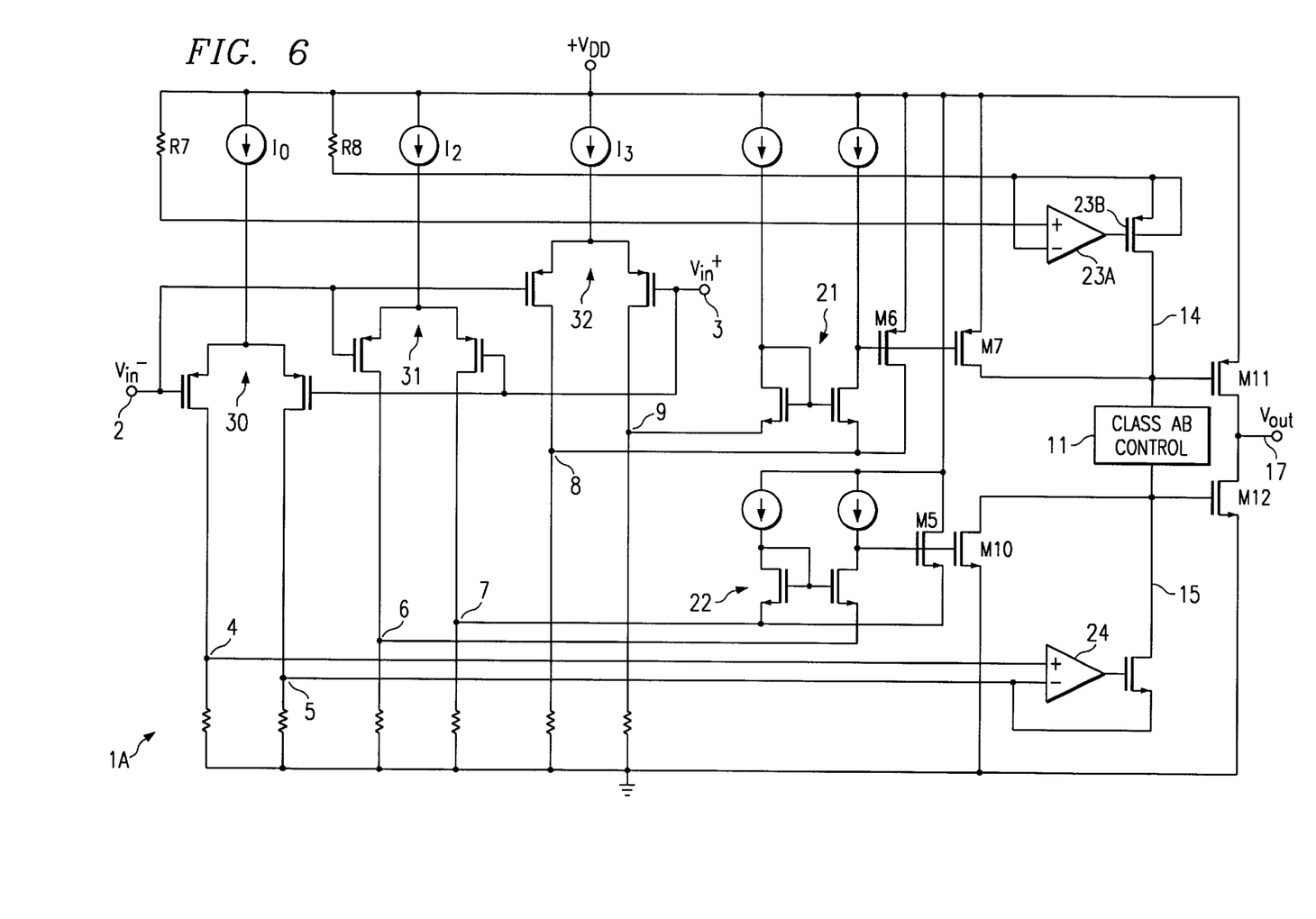
FIG. 6 is a schematic diagram of a more detailed implementation of the embodiment of FIG. 5.

FIG. 5 shows an operational amplifier 1A which is a slightly different implementation of the operational amplifier 1 of FIG. 1. Operational amplifier 1A of FIG. 5 utilizes a differential amplifier, a P-channel MOSFET 23B, and resistors R7 and R8 connected to shown instead of constant current sources 23 of FIG. 1. Also, operational amplifier 1A of FIG. 5 shows a slightly different connection of the drains of MOSFETs M5 and M10 than in FIG. 1. Specifically, in FIG. 5, the drain of MOSFET M5 is connected to $+V_{DD}$ instead of conductor 15. FIG. 6 shows a diagram that is essentially identical to FIG. 5, except that exemplary circuit implementations of boost amplifiers 21 and 22 are shown.

While the invention has been described with reference to several particular embodiments thereof, those skilled in the art will be able to make the various modifications to the described embodiments of the invention without departing from the true spirit and scope of the invention. It is intended that all elements or steps which are insubstantially different or perform substantially the same function in substantially the same way to achieve the same result as what is claimed are within the scope of the invention. For example, the MOSFETs in the described embodiment can be replaced by corresponding bipolar PNP and NPN transistors, respectively, in which case circuit operation will be basically the same. As another example, the load circuits of unbalanced differential amplifier 31 and 32 need not be the resisters shown in the drawings, and instead of other, the load circuits could be utilized. As yet another example, in some applications it may be desirable to provide only slew-up boost circuitry or slew-down boost circuitry, but not both. Although only CMOS implementations have been described herein, the basic slew rate boost technique described herein can also be used in bipolar integrated circuit operational amplifiers.

What is claimed is:

1. An operational amplifier comprising:
 (a) a differential input stage having first and second input conductors and first and second output conductors;
 (b) a class AB output stage including a pull-up transistor having an emitter coupled to a first supply voltage, a collector coupled to an output conductor, and a base coupled to a first terminal of a class AB control circuit, and a pull-down transistor having an emitter coupled to a second supply voltage, a collector coupled to the output conductor, and a base coupled to a second terminal of the class AB control circuit;
 (c) a gain stage having an input coupled to at least one of the first and second output conductors of the differential input stage, the gain stage having an output coupled to the second terminal of the class AB control circuit;
 (d) a slew rate boost circuit including
  i. a first unbalanced differential amplifier having a first input coupled to the first input conductor and a second input coupled to the second input conductor and also having first and second output conductors, and a second unbalanced differential amplifier having a first input coupled to the first input conductor and a second input coupled to the second input conductor and also having first and second output conductors,
  ii. a first boost amplifier having first and second inputs coupled to the first and second outputs, respectively, of the first unbalanced amplifier, and a second boost amplifier having first and second inputs coupled to the first and second outputs, respectively, of the second unbalanced amplifier,
  iii. first and second transistors each having a base coupled to an output of the first boost amplifier, the first transistor having an emitter coupled to the second output of the first unbalanced amplifier and a collector coupled to the first supply voltage, the second transistor having an emitter coupled to the second supply voltage and a collector coupled to the second terminal of the class AB control circuit,
  iv. third and fourth transistors each having an emitter coupled to the first supply voltage and a base coupled to an output of the second boost amplifier, the third transistor having a collector coupled to the first output of the second unbalanced amplifier, the fourth transistor having a collector coupled to the first terminal of the class AB control circuit.

2. An operational amplifier comprising:
 (a) a differential input stage having first and second input conductors and first and second output conductors;
 (b) a class AB output stage including a pull-up transistor having an emitter coupled to a first supply voltage, a collector coupled to an output conductor, and a base coupled to a first terminal of a class AB control circuit, and a pull-down transistor having an emitter coupled to a second supply voltage, a collector coupled to the output conductor, and a base coupled to a second terminal of the class AB control-circuit;
 (c) at least one of the first and second output conductors of the differential input stage being coupled to the second terminal of the class AB of the control circuit;
 (d) a slew rate rate boost circuit including
  i. a first unbalanced differential amplifier having a first input coupled to the first input conductor and a second input coupled to the second input conductor and also having first and second output conductors, and a second unbalanced differential amplifier having a first input coupled to the first input conductor and a second input coupled to the second input conductor and also having first and second output conductors,
  ii. a first boost amplifier having first and second inputs coupled to the first and second outputs, respectively, of the first unbalanced amplifier, and a second boost amplifier having first and second inputs coupled to the first and second outputs, respectively, the second unbalanced amplifier,
  iii. first and second transistors each having a base coupled to an output of the first boost amplifier, the first transistor having an emitter coupled to the second output of the first unbalanced amplifier and a collector coupled to the first supply voltage, the second transistor having an emitter coupled to the second supply voltage and a collector coupled to the second terminal of the class AB control circuit,
  iv. third and fourth transistors each having an emitter coupled to the first supply voltage and a base coupled to an output of the second boost amplifier, the third transistor having a collector coupled to the first output of the second unbalanced amplifier, the fourth transistor having a collector coupled to the first terminal of the class AB control circuit.

3. An operational amplifier comprising:
(a) a differential input stage having first and second input conductors and first and second output conductors;
(b) a class AB output stage including a pull-up transistor having a source coupled to a first supply voltage, a drain coupled to an output conductor, and a gate coupled to a first terminal of a class AB control circuit, and a pull-down transistor having a source coupled to a second supply voltage, a drain coupled to the output conductor, and a gate coupled to a second terminal of the class AB control-circuit;
(c) a gain stage having an input coupled to at least one of the first and second output conductors of the differential input stage, the gain stage having an output coupled to the second terminal of the class AB control circuit;
(d) a slew rate boost circuit including
   i. a first unbalanced differential amplifier having a first input coupled to the first input conductor and a second input coupled to the second input conductor and also having first and second output conductors, and a second unbalanced differential amplifier having a first input coupled to the first input conductor and a second input coupled to the second input conductor and also having first and second output conductors,
   ii. a first boost amplifier having first and second inputs coupled to the first and second outputs, respectively, of the first unbalanced amplifier, and a second boost amplifier having first and second inputs coupled to the first and second outputs, respectively, of the second unbalanced amplifier,
   iii. first and second transistors each having a gate coupled to an output of the first boost amplifier, the first transistor having a source coupled to the second output of the first unbalanced amplifier and a drain coupled to the first supply voltage, the second transistor having a source coupled to the second supply voltage and a drain coupled to the second terminal of the class AB control circuit,
   iv. third and fourth transistors each having a source coupled to the first supply voltage and a gate coupled to an output of the second boost amplifier, the third transistor having a drain coupled to the first output of the second unbalanced amplifier, the fourth transistor having a drain coupled to the first terminal of the class AB control circuit.

4. The operational amplifier of claim 3 wherein the pull-up transistor is a P-channel transistor and the pull-down transistor is an N-channel transistor.

5. The operational amplifier of claim 4 wherein the first and second transistors are N-channel transistors and the third and fourth transistors are P-channel transistors.

6. The operational amplifier of claim 3 wherein the class AB output stage includes a quiescent bias current source coupled between the first supply voltage and the first terminal of the class AB control circuit.

7. The operational amplifier of claim 6 wherein the gain stage includes a differential amplifier having first and second inputs coupled to the first and second outputs, respectively, of the differential input stage, an N-channel transistor having a gate coupled to a reference voltage, a source coupled to an output of the differential amplifier, and a drain coupled to the second terminal of the class AB control circuit.

8. The operational amplifier of claim 3 wherein the first unbalanced differential amplifier includes a first input transistor having a gate coupled to the first input conductor and a drain coupled to the first output conductor of the first unbalanced differential amplifier, and also includes a second input transistor having a gate coupled to the second input terminal of the first unbalanced differential amplifier and a drain coupled to the second output of the first unbalanced differential amplifier, wherein the channel-width-to-channel-length ratio of the second input transistor is substantially greater than that of the first input transistor, and wherein the second unbalanced differential amplifier includes a first input transistor having a gate coupled to the first input conductor and a drain coupled to the first output conductor of the second unbalanced differential amplifier, and also includes a second input transistor having a gate coupled to the second input terminal of the second unbalanced differential amplifier and a drain coupled to the second output of the second unbalanced differential amplifier, wherein the channel-width-to-channel-length ratio of the first input transistor of the second unbalanced differential amplifier is substantially greater than that of the second input transistor of the second unbalanced differential amplifier.

9. A method of operating an amplifier including a differential input stage having first and second input conductors, a class AB output stage coupled to an output of the differential input stage and including a pull-up transistor having a source coupled to a first supply voltage, a drain coupled to an output conductor, and a gate coupled to a first terminal of a class AB control circuit, and a pull-down transistor having a source coupled to a second supply voltage, a drain coupled to the output conductor, and a gate coupled to a second terminal of the class AB control circuit, the method comprising:
(a) applying a differential input signal between the first and second input conductors, and simultaneously applying the differential input signal between first and second inputs of a first unbalanced differential amplifier and between first and second inputs of the second unbalanced differential amplifier;
(b) if the differential input signal is of a first polarity and is of a magnitude substantially greater than a threshold voltage of the first unbalanced differential amplifier, decreasing the magnitude of a turn-on voltage of the pull-down transistor and increasing the magnitude of a turn-on voltage of the pull-up transistor in response to an output voltage produced by the first unbalanced differential amplifier; and
(c) if the differential input signal is of a second polarity and is of a magnitude substantially greater than a threshold voltage of the second unbalanced differential amplifier, decreasing the magnitude of a turn-on voltage of the pull-up transistor and increasing the magnitude of a turn-on voltage of the pull-down transistor in response to an output voltage produced by the second unbalanced differential amplifier.

10. A method of operating an amplifier including a differential input stage having first and second input conductors, a class AB output stage coupled to an output of the differential input stage and including a pull-up transistor having an emitter coupled to a first supply voltage, a collector coupled to an output conductor, and a base coupled to a first terminal of a class AB control circuit, and a pull-down transistor having an emitter coupled to a second supply voltage, a collector coupled to the output conductor, and a base coupled to a second terminal of the class AB control circuit, the method comprising:

(a) applying a differential input signal between the first and second input conductors, and simultaneously applying the differential input signal between first and second inputs of a first unbalanced differential amplifier and between first and second inputs of the second unbalanced differential amplifier;

(b) if the differential input signal is of a first polarity and is of a magnitude substantially greater than a threshold voltage of the first unbalanced differential amplifier, decreasing the magnitude of a turn-on voltage of the pull-down transistor and increasing the magnitude of a turn-on voltage of the pull-up transistor in response to an output voltage produced by the first unbalanced differential amplifier; and (c) if the differential input signal is of a second polarity and is of a magnitude substantially greater than a threshold voltage of the second unbalanced differential amplifier, decreasing the magnitude of a turn-on voltage of the pull-up transistor and increasing the magnitude of a turn-on voltage of the pull-down transistor in response to an output voltage produced by the second unbalanced differential amplifier.

* * * * *